United States Patent
Kobayashi

(10) Patent No.: US 6,248,223 B1
(45) Date of Patent: *Jun. 19, 2001

(54) SPUTTERING APPARATUS

(75) Inventor: Masahiko Kobayashi, Kanagawa (JP)

(73) Assignee: Anelva Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/502,575

(22) Filed: Feb. 11, 2000

Related U.S. Application Data

(63) Continuation of application No. 08/859,717, filed on May 21, 1997, now Pat. No. 6,071,390.

(30) Foreign Application Priority Data

May 21, 1996 (JP) .................................................. 8-150044

(51) Int. Cl.$^7$ .................................................. C23C 14/35
(52) U.S. Cl. .............................. 204/298.19; 204/198.15; 204/298.12; 204/298.07; 204/192.12
(58) Field of Search ........................ 204/298.07, 298.12, 204/298.15, 298.19, 298.2, 192.12, 192.15, 192.17

(56) References Cited

U.S. PATENT DOCUMENTS

| | | | |
|---|---|---|---|
| 4,169,031 | 9/1979 | Brors | 204/298.19 |
| 4,816,126 | 3/1989 | Kamoshida et al. | 204/192.3 |
| 5,232,569 | 8/1993 | Nelson et al. | 204/192.15 |
| 5,330,628 | 7/1994 | Demaray et al. | 204/192.12 |
| 6,071,390 * | 6/2000 | Kobayashi | 204/298.19 |

OTHER PUBLICATIONS

Applicant's specifiction, p. 3, lines 24–26; p. 4, lines 1–13.

* cited by examiner

*Primary Examiner*—Rodney G. McDonald
(74) *Attorney, Agent, or Firm*—Sughrue, Mion, Zinn, Macpeak & Seas, PLLC

(57) ABSTRACT

A sputtering apparatus which is used in a film depositing step in manufacturing a semiconductor integrated circuit or the like. In a vacuum vessel, a target and a substrate are disposed so as to be coaxial and parallel with and oppose each other, and a thin film is deposited on the inner face of a fine hole which is formed in the surface of the substrate. The target has a size Dt at which relationships that $Q_1=N \cdot Q_2$ and that N is not smaller than 0.7, and more preferably not smaller than 0.7 and not larger than 1.2 are established between an angle $Q_1$ satisfying $\tan Q_1=(Dt-Ds)/2L$, and an angle $Q_2$ satisfying $\tan Q_2=A/B$ where A indicates a diameter of the opening of the fine hole, B indicates a depth of the hole, Ds indicates a size of the substrate, and L indicates a distance between the target and the substrate.

6 Claims, 5 Drawing Sheets

$$\tan Q_2 = \frac{A}{B}$$

$$\tan Q_1 = \frac{D_t - D_s}{2L}$$

FIG. 6

| | PERIPHERAL PORTION | VICINITY OF CENTER AXIS |
|---|---|---|
| COVERED STATE BY SPUTTER FILM | | |
| OUTER CORNER PORTION | $\dfrac{t1}{T} \times 100\%$ (50%) | $\dfrac{t1}{T} \times 100\%$ (45%) |
| INNER CORNER PORTION | $\dfrac{t2}{T} \times 100\%$ (25%) | $\dfrac{t2}{T} \times 100\%$ (45%) |

SPUTTERING APPARATUS

This is a continuation of application Ser. No. 08/859,717 filed May 21, 1997, now U.S. Pat. No. 6,071,390 the disclosure of which is incorporated herein by reference.

BACKGROUND OF THE INVENTION

1. Field of the Invention

The invention relates to a sputtering apparatus, and particularly to a sputtering apparatus which is used in a film depositing step in manufacturing a semiconductor integrated circuit or the like.

2. Description of the Related Art

In a thin film deposition using sputtering, and particularly in sputtering used in a film depositing step for manufacturing a highly-integrated semiconductor device, it is strongly recommended to deposit a film at the bottom of a fine hole of a high aspect ratio with an excellent step coverage property, that is, to improve the bottom coverage ratio (the film thickness on the bottom face of the hole with respect to that on the upper face of the hole). As the degree of integration of an integrated circuit becomes higher as 64 Mbits, 256 Mbits, and 1 Gbits, for example, the aspect ratio of a hole (the depth of the hole/the diameter or width of the hole) is increased to 2 to 4. It is recommended to fill a fine hole of such a high aspect ratio with a high bottom coverage ratio.

In order to comply with the requirement, improvements have been made so that a film is deposited while allowing only sputter particles (sputter flux) of a small incident angle to enter a fine hole. One of the improvements is a technique called collimate sputtering.

FIG. 4 is a view schematically illustrating a collimate sputtering apparatus as an example of a conventional sputtering apparatus in which the bottom coverage ratio is improved. In the apparatus shown in FIG. 4, a cathode 2 and a substrate holder 3 are disposed so as to oppose each other in a vacuum vessel 1 having an exhaust system. The cathode 2 comprises a magnet mechanism 4, and a target 5 which is located in front of the magnet mechanism 4. A substrate 30 on which a film is to be deposited is placed on the front face of the substrate holder 3.

A collimator 6 is disposed in a space between the cathode 2 and the substrate holder 3. The collimator 6 has a structure in which a number of small cylindrical members are arranged in a segmental form so that their height directions coincide with a direction perpendicular to the substrate 30 (hereinafter, the direction is referred to as the axial direction), whereby many flow paths for sputter particles are segmentally formed along the axial direction. This structure is often called a "grid-shaped" or "honeycomb" structure.

Sputter particles emitted from the target 5 are distributed in accordance with the cosine law. Therefore, also many sputter particles of a large incident angle enter the collimator 6. However, most of such sputter particles are deposited on the wall faces of the flow paths of the collimator 6, with the result that sputter particles passed through the collimator 6 mainly consist of those of a small emittance angle. Consequently, only sputter particles of a small incident angle impinge on the substrate 30, so that the step coverage property for the bottom of a fine hole formed in the surface of the substrate 30 is improved.

In the collimate sputtering apparatus described above, however, the deposition of sputter particles on the collimator 6 reduces the sectional areas of the flow paths of the collimator 6, with the result that the amount of sputter particles which can pass through the collimator 6 is reduced with the passage of time. Therefore, the deposition rate is gradually lowered.

Recently, an apparatus which is called a low-pressure long-distance sputtering apparatus and in which the distance between a target and a substrate (hereinafter, the distance is referred to as the TS distance) is increased (3 to 6 times that of the conventional apparatus) has been developed as a sputtering apparatus which is free from the above problem and which has a high bottom coverage ratio. FIG. 5 is a view schematically illustrating a low-pressure long-distance sputtering apparatus as another example of a conventional sputtering apparatus.

In the apparatus shown in FIG. 5, in the same manner as that of FIG. 4, a cathode 2 and a substrate holder 3 are disposed so as to oppose each other in a vacuum vessel 1 having an exhaust system, a target 5 is located in front of a magnet mechanism 4, and a substrate 30 is placed on the front face of the substrate holder 3. The TS distance is set to be, for example, about 150 to 360 mm. The pressure of the interior of the vacuum vessel 1 is set to be lower than that in the conventional system or to be about 1 mTorr or less. This pressure reduction is conducted in order that the mean free path of sputter particles is increased and sputter particles are less scattered. Since scattering of sputter particles is reduced in level, many sputter particles can impinge on the substrate 30 in a direction substantially perpendicular to the substrate, thereby enabling the bottom coverage ratio of a fine hole to be improved.

The above-described low-pressure long-distance sputtering is superior to the collimate sputtering as well as the conventional sputtering. In the case where sputtering is conducted on a fine hole of the aspect ratio of 2, for example, the conventional sputtering can attain a bottom coverage ratio of about 5 to 7%, and the collimate sputtering that of about 15 to 20%. In contrast, the low-pressure long-distance sputtering can attain a bottom coverage ratio as high as about 40 to 45% under the conditions that the TS distance is 340 mm and the pressure is 0.3 mTorr.

In this way, the low-pressure long-distance sputtering can attain a high bottom coverage ratio required in a next-generation integrated circuit which is further highly integrated, and is a sputtering process which receives greatest attention. However, there remains a problem which even the low-pressure long-distance sputtering cannot solve. This problem is that, in the coverage of a fine hole existing in a peripheral portion of a substrate, the coverage ratio of the bottom of the hole is not balanced.

This will be described with reference to FIG. 6. FIG. 6 is a view illustrating imbalance of the bottom coverage ratio of a fine hole existing in a peripheral portion of a substrate. As shown in FIG. 6, in a fine hole existing in the vicinity of the center axis of the substrate, a film is deposited so as to be substantially uniform over the whole bottom face of the hole. In a fine hole existing in a peripheral portion remote from the center axis, however, a film is deposited in a larger thickness at a corner portion formed by the bottom face and the side wall which is remoter from the center axis (hereinafter, such a corner portion is referred to as "outer corner portion"), and in a very small thickness at a corner portion formed by the bottom face and the side wall which is closer to the center axis (hereinafter, such a corner portion is referred to as "inner corner portion").

When, in the same manner as the bottom coverage ratio, the coverage ratios at the outer and inner corner portions (hereinafter, such a rate is referred to as "corner coverage ratio") are obtained as values with respect to the thickness of a film on the upper face of the hole, the corner coverage ratios can be respectively expressed as (the film thickness t1 at the outer corner portion/the film thickness T on the upper face of the hole)×100 (%), and (the film thickness t2 at the inner corner portion/the film thickness T on the upper face of the hole)×100 (%). When film deposition is conducted on a fine hole of the aspect ratio of 2 by the low-pressure long-distance sputtering under the conditions that the TS distance is 340 mm and the pressure is 0.3 mTorr, the corner coverage ratios listed in Table 1 are obtained.

TABLE 1

|  | Peripheral Portion | Vicinity of Center Axis |
|---|---|---|
| Corner Coverage Ratio at Outer Corner Portion | 50% | 45% |
| Corner Coverage Ratio at Inner Corner Portion | 25% | 45% |

It is considered that such unbalance of the bottom coverage ratio in a fine hole in a peripheral portion of a substrate is largely affected by the direction of the flight of sputter particles reaching the substrate. Namely, many of sputter particles entering a fine hole in a peripheral portion of a substrate obliquely fly from the side of the center axis of the substrate to the side of the peripheral edge of the substrate. Sputter particles which fly in the opposite direction, i.e., from the side of the peripheral edge of the substrate to the side of the center axis are very small in number. This phenomenon seems to cause the above-mentioned imbalance of the coverage ratio of a fine hole in a peripheral portion.

Such imbalance of the bottom coverage ratio may result in a significant defect in device performance, and hence causes the production yield to be lowered. In an example case where a fine hole is formed as a contact hole (or a through hole) and a sputter film such as that described above is deposited as a barrier film for preventing mutual diffusion of a wiring material and a foundation material from occurring, when the bottom coverage ratio is unbalanced, a phenomenon which impairs electric characteristics, such as a junction leak, occurs at an inner corner portion at which the film thickness is smaller, thereby largely lowering the device performance.

In order to produce a larger number of devices from one substrate and improve the productivity, the size of a substrate tends to be enlarged. When a large substrate is used, the above-mentioned imbalance of the bottom coverage ratio in a hole in a peripheral portion of the substrate produces a more serious problem. In other words, when a substrate which is relatively larger in size than the target is used, sputter particles obliquely flying from the outside to the side of the center axis are not entirely expected to reach the portion of the surface area of the substrate and having a diameter which is larger than that of the target, with the result that the film thickness at the inner corner portion is substantially zero.

SUMMARY OF THE INVENTION

The invention has been made in order to solve the above problem. It is an object of the invention to provide a sputtering apparatus which can eliminate imbalance of the bottom coverage ratio in a hole that is often observed in a peripheral portion of a substrate, whereby also devices of various kinds having a fine hole of a high aspect ratio are allowed to be manufactured with a satisfactory yield.

In order to attain the above object, the invention provides a sputtering apparatus comprising: a vacuum vessel having an exhaust system; a cathode which is disposed in the vacuum vessel and has a target on a front face thereof; and a substrate holder which is used for disposing a substrate so as to be coaxial with and oppose the target in parallel, so that a thin film is deposited on an inner face of a hole formed in a surface of the substrate, wherein the target of the cathode has a size Dt at which relationships that $Q_1 = N \cdot Q_2$ and that N is not smaller than 0.7 are established between an angle $Q_1$ satisfying $\tan Q_1 = (Dt-Ds)/2L$, and an angle $Q_2$ satisfying $\tan Q_2 = A/B$ where A indicates a diameter or width of an opening of the hole in which the thin film is to be deposited, B indicates a depth of the hole, Ds indicates a size of the substrate, and L indicates a distance between the target and the substrate.

Also, the invention provides a sputtering apparatus comprising: a vacuum vessel having an exhaust system; a cathode which is disposed in the vacuum vessel and has a target on a front face thereof; and a substrate holder which is used for disposing a substrate so as to be coaxial with and oppose the target in parallel, so that a thin film is deposited on an inner face of a hole formed in a surface of the substrate, wherein the target of the cathode has a size Dt at which relationships that $Q_1 = N \cdot Q_2$ and that N is not smaller than 0.7 and not larger than 1.2 are established between an angle $Q_1$ satisfying $\tan Q_1 = (Dt-Ds)/2L$, and an angle $Q_2$ satisfying $\tan Q_2 = A/B$ where A indicates a diameter or width of an opening of the hole in which the thin film is to be deposited, B indicates a depth of the hole, Ds indicates a size of the substrate, and L indicates a distance between the target and the substrate.

BRIEF DESCRIPTION OF THE DRAWINGS

FIG. 6 is a view illustrating unbalance of the bottom coverage ratio of a fine hole existing in a peripheral portion of a substrate.

DETAILED DESCRIPTION OF THE PREFERRED EMBODIMENT

Hereinafter, an embodiment of the invention will be described.

Figure 1:
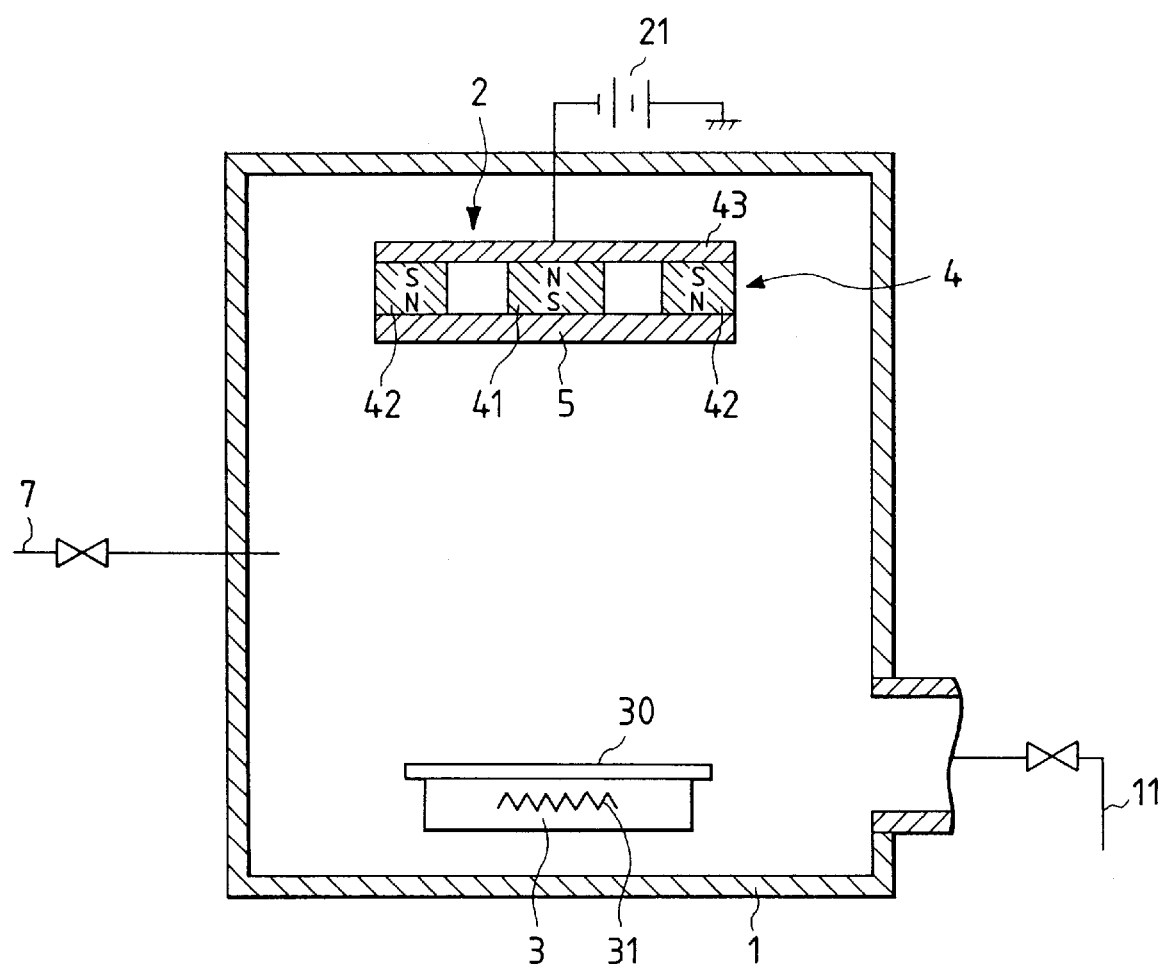
FIG. 1 is a view schematically illustrating the configuration of a sputtering apparatus of an embodiment of the invention.

FIG. 1 is a view schematically illustrating the configuration of a sputtering apparatus of an embodiment of the invention.

The sputtering apparatus shown in FIG. 1 comprises: a vacuum vessel 1 having an exhaust system 11; a cathode 2 which is disposed in the vacuum vessel 1 and provided with a target 5 on the front face; and a substrate holder 3 which is used for disposing a substrate 30 so as to be coaxial and parallel with the target 5 and oppose the target.

In order to conduct the low-pressure long-distance sputtering, the exhaust system 11 is configured so as to exhaust the interior of the vacuum vessel 1 to a pressure of about $3 \times 10^{-8}$ Torr. A load-lock chamber or a transfer chamber which is not shown is airtightly connected to the vacuum vessel 1. Even when the substrate 30 is to be transferred into or taken out from the vacuum vessel 1, the interior of the vacuum vessel 1 is prevented from being opened to the atmosphere.

The sputtering apparatus of the embodiment is configured so as to conduct magnetron sputtering, and the cathode 2 serves as a magnetron cathode. Specifically, the cathode 2 comprises a magnet mechanism 4 including: a center magnet 41 which is disposed at the center; an annular peripheral magnet 42 which surrounds the center magnet 41; and a plate-shaped yoke 43 which holds the center magnet 41 and the peripheral magnet 42. The target 5 is disposed so as to cover the front face of the magnet mechanism 4.

A cathode power source 21 which applies a voltage necessary for sputtering to the cathode 2 is connected to the cathode 2. The cathode power source 21 applies a given negative DC voltage or high-frequency voltage to the cathode 2.

In the embodiment, the target 5 is positioned in an upper portion of the interior of the vacuum vessel 1 so as to have a horizontal posture, and the substrate holder 3 is configured so as to hold the substrate 30 with a horizontal posture below the target 5. In a state where the substrate 30 is held by the substrate holder 3, the substrate 30 is coaxial with the target 5, or the center axis of the substrate 30 coincides with that of the target 5. Heating means 31 for heating the substrate 30 is disposed in the substrate holder 3. As required, a substrate bias power source (not shown) for applying a high-frequency voltage to the substrate holder 3 to give a fixed bias voltage to the substrate 30 is connected to the substrate holder 3.

The apparatus of the embodiment further comprises a gas introducing system 7 which introduces a gas into the vacuum vessel 1. For example, the gas introducing system 7 introduces a discharging gas such as argon required for sputtering discharge.

In the thus configured apparatus of the embodiment, the substrate 30 is transferred into the vacuum vessel 1 through a gate valve which is not shown, and then placed on the substrate holder 3. The gas introducing system 7 is operated so as to introduce the discharging gas, and the cathode power source 21 is then operated so as to apply the given voltage to the cathode 2, thereby sputtering the target 5. As a result, a thin film is deposited on the substrate 30 placed on the substrate holder 3. When the thickness of the thin film reaches a given value, the operations of the cathode power source 21 and the gas introducing system 7 are stopped, and the substrate 30 is taken out from the vacuum vessel 1.

The apparatus of the embodiment is mainly characterized in that the target 5 of an optimum size is used in accordance with the size of the substrate 30 on which a film is to be deposited, the aspect ratio, the TS distance, etc. This will be described with reference to FIGS. 2 and 3.

Figure 2:
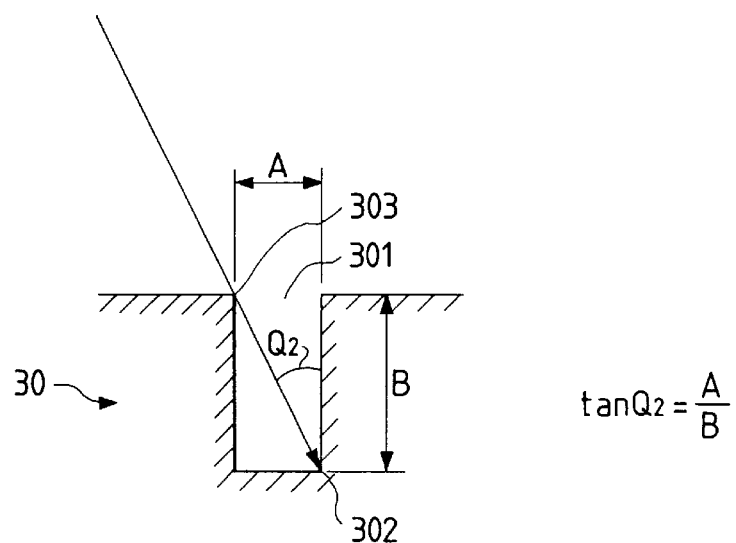
FIG. 2 illustrates the selection of the size of a target used in the sputtering apparatus of FIG. 1 and is a schematic section view illustrating a fine hole formed in a substrate.
Figure 3:
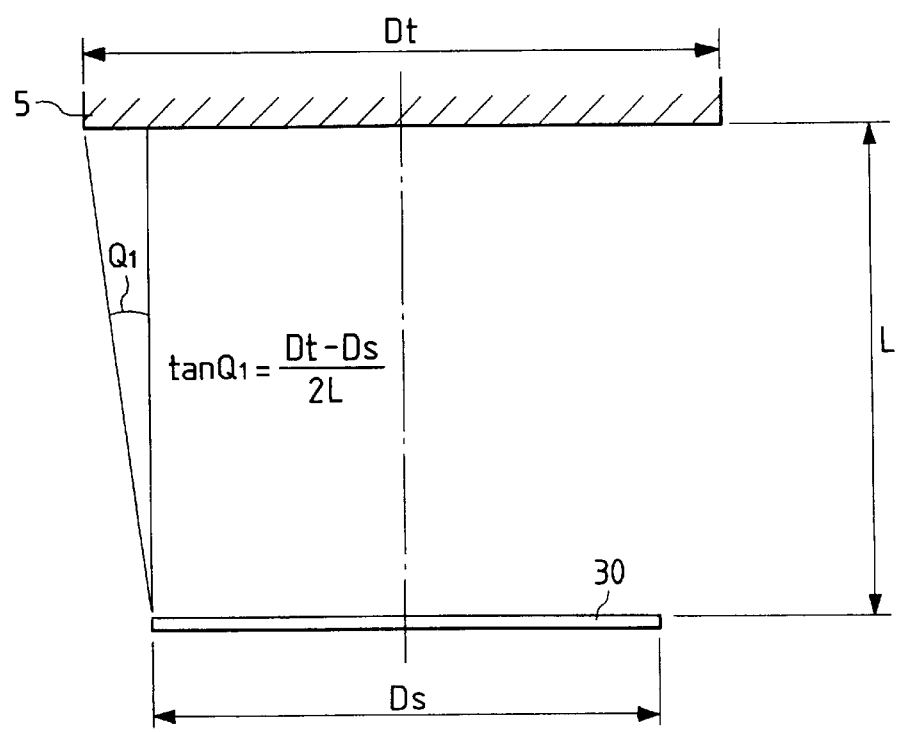
FIG. 3 illustrates the selection of the size of the target used in the sputtering apparatus of FIG. 1 and is a diagrammatic view illustrating parameters of a size Dt of the target, a size Ds of the substrate, and a TS distance L.
Figure 4:
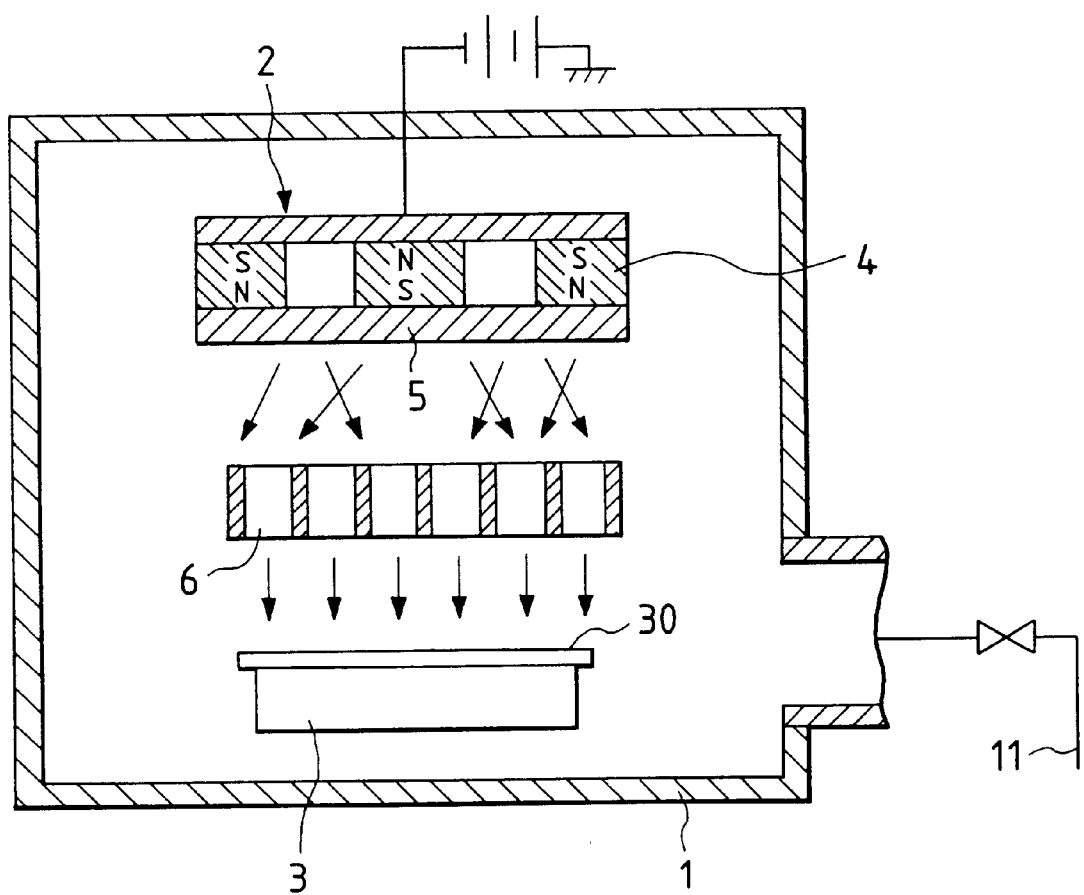
FIG. 4 is a view schematically illustrating a collimate sputtering apparatus as an example of a conventional sputtering apparatus.
Figure 5:
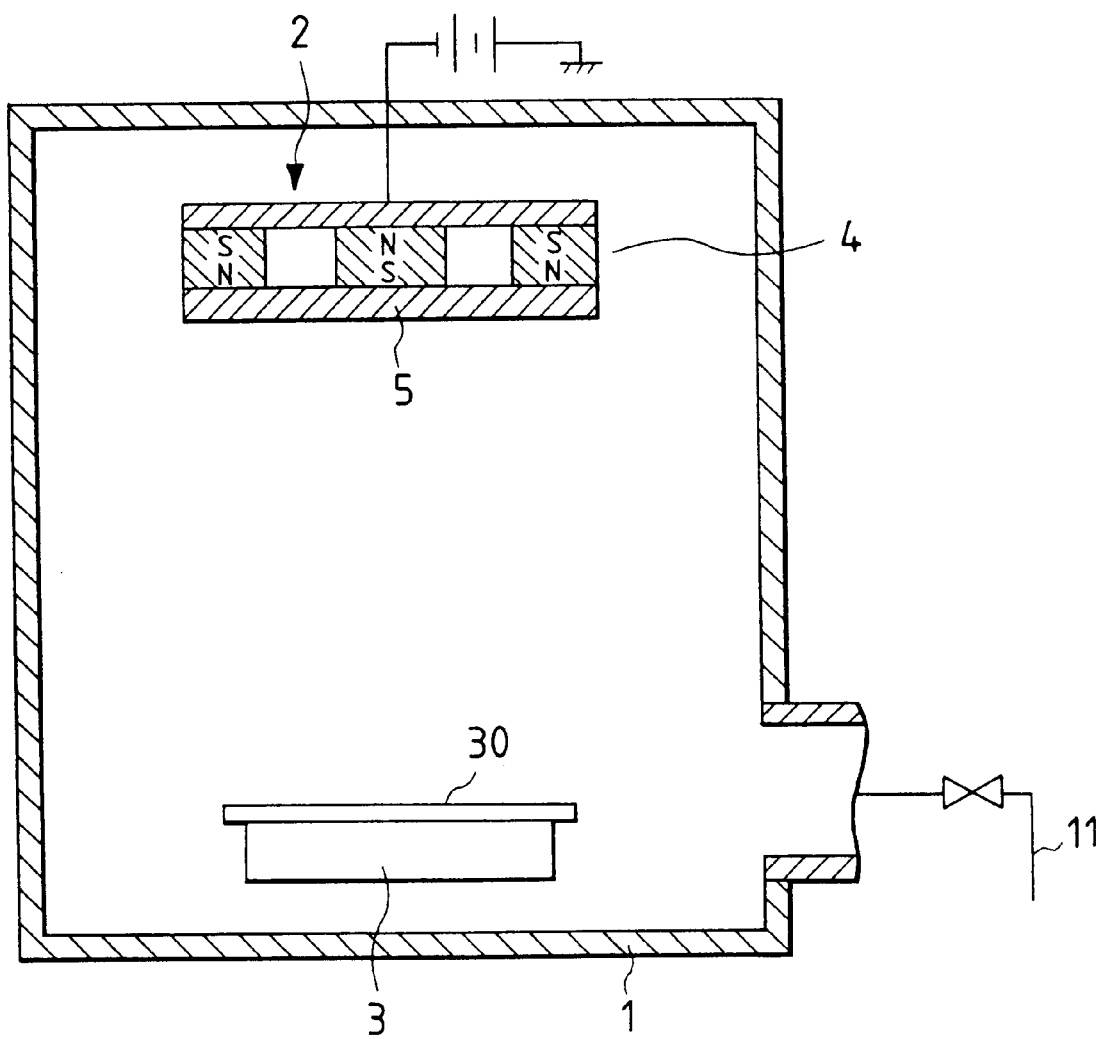
FIG. 5 is a view schematically illustrating a low-pressure long-distance sputtering apparatus as another example of a conventional sputtering apparatus.

FIGS. 2 and 3 are views illustrating the selection of the size of the target used in the sputtering apparatus of FIG. 1. FIG. 2 is a schematic section view illustrating a fine hole formed in a substrate, and FIG. 3 is a diagrammatic view illustrating parameters of the size Dt of the target, the size Ds of the substrate, and the TS distance L. In the following description, an example in which it is assumed that both the target 5 and the substrate 30 have a circular plate-like shape will be described.

Fine holes 301 are previously formed in the surface of the substrate 30. The fine holes 301 may be contact holes for field effect transistors (FETS) or the like, or through holes for interlayer wiring. The aspect ratio of each fine hole 301 is expressed as B/A where A indicates the diameter or width of the opening of the fine hole 301 shown in FIG. 2 and B indicates the depth of the fine hole 301. In the following description, it is assumed that the opening of the fine hole 301 has a circular shape and A indicates the diameter of the opening.

Studies conducted by the inventor have shown that, when sputter film deposition is to be conducted on the substrate 30 having the fine holes 301 of the aspect ratio B/A, the target 5 which is larger than at least the substrate 30 must be used in order that the film deposition is conducted also on the fine hole 301 existing in a peripheral portion of the substrate 30 without producing the above-mentioned imbalance of the bottom coverage ratio in the hole. Specifically, when the diameter of the substrate 30 is indicated by Ds and that of the target 5 by Dt, at least Dt>Ds must be satisfied. This is because, if Dt>Ds is not satisfied, few sputter particles obliquely flying from the outside to the side of the center axis enter the fine hole 301 existing in a peripheral portion of the substrate 30.

According to studies conducted by the inventor, however, it has been found that the relationship of Dt>Ds is not sufficient, and a sufficient bottom coverage ratio cannot be attained for the fine hole 301 existing in a peripheral portion of the substrate 30 unless Dt is greater than Ds by a certain degree. This will be described in more detail with reference to FIG. 3.

The problem about selection of the degree by which the diameter Dt of the target 5 must be greater than the diameter Ds of the substrate 30 can be replaced with a problem about selection of the degree by which an angle $Q_1$ formed by a line connecting a point on the peripheral edge of the target 5 and that on the peripheral side of the substrate 30 by the shortest distance, with respect to the direction of the center axis, is increased.

The most severe condition is exposed on coverage of the bottom of the fine hole 301 in the case where the fine hole 301 is positioned in a portion remoter from the center axis. Although impossible in an actual case, the most severe condition is that coverage is to be performed also on the fine hole 301 existing on the peripheral edge of the substrate 30 with a sufficient bottom coverage ratio. If this is realized, it is considered that a sufficient bottom coverage ratio can be attained also in the fine hole 301 inner than that hole (closer to the center axis).

The incident angle of sputter particles entering a postulated fine hole 301 existing in the periphery of the substrate 30 will be considered. The above-mentioned angle $Q_1$ corresponds to the largest one (hereinafter, referred to as "maximum incident angle") among the incident angles of sputter particles which obliquely fly from the outside to the side of the center axis and enter the fine hole 301 in the periphery.

On the other hand, the above-mentioned imbalance of the bottom coverage ratio can be eliminated from the fine hole 301 of the aspect ratio B/A as shown in FIG. 2, by increasing the maximum incident angle $Q_1$ to a value which is approximately equal to an angle $Q_2$ formed by a line connecting the inner corner portion 302 of the bottom face of the hole and the opposite point 303 on the opening edge of the hole with respect to the depth direction of the hole. When the maximum incident angle $Q_1$ is smaller than $Q_2$, the amount of sputter particles reaching the inner corner portion 302 is relatively reduced, and hence the bottom coverage ratio of the inner corner portion 302 is lowered. When the maximum incident angle $Q_1$ is larger than $Q_2$, sputter particles of an incident angle which are larger than $Q_2$ fail to reach the inner corner portion 302 and are deposited on the side wall, with the result that the sputter particles are useless for the coverage of the inner corner portion 302. When the maximum incident angle $Q_1$ is equal to $Q_2$, therefore, the highest corner coverage ratio for the fine hole 301 existing in the peripheral edge of the substrate 30 can be obtained without waste.

Since A/B which is the reciprocal of the aspect ratio is equal to tan $Q_2$, the above can be expressed with $$\tan Q_1 = A/B = \tan Q_2 \qquad (1)$$

When expression (1) is rewritten by using the diameter Ds of the substrate 30, the diameter Dt of the target 5, and the TS distance L, the following expression is obtained:

$$\tan Q_1 = A/B = \tan Q_2 = (Dt-Ds)/2L \quad (2)$$

The inventor has conducted many experiments based on this observation. As a result, it has been found that excellent uniformity of the hole bottom coverage ratio can be obtained in a fixed range including the conditions satisfying expression (2). Results of the experiments are schematically shown in Table 2 below.

First, in order to select the diameter Dt of the target 5, expression (2) is generalized and it is assumed that, for angles $Q_1$ and $Q_2$ respectively satisfying $$\tan Q_1 = (Dt-Ds)/2L,$$

and $$\tan Q_2 = A/B,$$

the relationship of $Q_1 = N \cdot Q_2$ holds. In other words, expression (2) can be generalized as $$\tan Q_1 = A/B = \tan(N \cdot Q_2) = (Dt-Ds)/2L \quad (3)$$

In the experiments shown in Table 2, the bottom coverage ratios of the bottom faces of the fine holes 301 were checked while changing the coefficient N of expression (3) in the range of 0 to 1.5.

The experiments have been conducted under the following conditions in addition to those listed in Table 2:

pressure: 0.3 mTorr material of the target: titanium temperature of the substrate: 250° C.

cathode voltage: −700 V.

TABLE 2

| Experiment | N | Ds (mm) | Dt (mm) | L (mm) | Bottom Coverage Ratio | | Film Deposition Rate (relative value) |
|---|---|---|---|---|---|---|---|
| | | | | | Outer Corner Portion | Inner Corner Portion | |
| a | 0 | 300 | 300 | 300 | 50% | 25% | 2.3 |
| b | 0.7 | 300 | 400 | 300 | 45% | 40% | 1.3 |
| c | 1 | 300 | 450 | 300 | 45% | 43% | 1 |
| d | 1.2 | 300 | 480 | 300 | 45% | 43% | 0.9 |
| e | 1.3 | 300 | 530 | 300 | 45% | 44% | 0.7 |

As seen from Table 2 above, when N is not smaller than 0.7, a bottom coverage ratio of 40% is obtained also at the inner corner portion 302, and it will be seen that this range of N is appropriate. Although not shown in Table 2, in the range of 0<N<0.7, the bottom coverage ratio at the inner corner portion 302 is largely lower than 40%, and hence this range is not appropriate.

The film deposition rates listed in Table 2 are values by converting the actually obtained film deposition rates, by using the power density or the power per unit area which is obtained by dividing the power supplied to the cathode 2 by the area of the front face of the target 5. Namely, the unit of the film deposition rates is (angstroms/second)/(watts/mm²). In Table 2, the converted values of the film deposition rates are expressed as relative values with respect to the value obtained in the case of N=1.

Table 2 shows that the film deposition rate is reduced as N becomes larger. This means that, when the target 5 is made larger, the film deposition rate converted by using the power density is lowered. In other words, when the target 5 is increased in size, the film deposition rate is lowered unless the power density is increased by a degree which is larger than that corresponding to the increased size. Although data are not shown in Table 2, when N exceeds 1.2, the film deposition rate is rapidly lowered. From the viewpoint of the energy efficiency, it is preferable to set N so as not to be larger than 1.2. The use of a large target in which N exceeds 1.2 produces defects that it is difficult to conduct maintenance works such as replacement of the target, and that parts required for mounting the target are increased in number and complicated.

When the above discussion is summarized, the conclusion is that N of expression (3) is preferably set so as to be $0.7 \leq N \leq 1.2$ in order to obtain a sufficient bottom coverage ratio with an excellent energy efficiency. Under given conditions, therefore, the diameter Dt of the target 5 is selected so that N is in the above range. Specifically, the aspect ratio B/A depends on the design of a device to be produced, and the TS distance is suitably decided in consideration of the effect of the low-pressure long-distance sputtering is attained. As a matter of course, the diameter Ds of the substrate 30 is predetermined. In accordance with expression (3), therefore, Dt is determined under these previously given conditions so that $0.7 \leq N \leq 1.2$.

When Dt is determined in this way, imbalance of the hole bottom coverage ratio in the fine hole 301 in a peripheral portion which has been conventionally observed can be eliminated, and a sufficient bottom coverage ratio can be uniformly obtained over the whole bottom face of the fine hole 301. The imbalance of the hole bottom coverage ratio in the fine hole 301 in a peripheral portion is a phenomenon which is generally observed also in sputtering other than the low-pressure long-distance sputtering. Consequently, the configuration having Dt which satisfies the above-mentioned conditions is effective also in sputtering apparatuses of various methods other than the low-pressure long-distance sputtering.

In the above description, it is assumed that the opening of the fine hole 301 has a circular shape and A indicates the diameter of the opening. The invention is applicable also in cases other than this assumption. In the case where the fine hole is formed as a groove elongating in a specific direction, for example, the width of the groove is used as A. In the case where the fine hole is formed into a shape other than a circle and a groove, the width of the opening in a specific direction is used as A. In this case, in order to attain the coverage at a high bottom coverage ratio over the whole bottom face of the fine hole, it is preferable to set the width A in the direction along which the most severe (highest) aspect ratio is obtained. In the case where the opening of the fine hole has a rectangular shape, for example, the length in the direction of the short side is used as the width A, and Dt is selected so as to satisfy the above-mentioned conditions in which the reciprocal A/B of the aspect ratio as seen in this direction is used.

Also in the case where the substrate 30 or the target 5 has a shape other than a circle, Ds and Dt should be determined so that most severe conditions are imposed. Specifically, in a state where the substrate 30 and the target 5 are disposed so as to be coaxial and parallel with and oppose each other as shown in FIG. 3, the direction along which the difference between the width of the target 5 and that of the substrate 30 is minimum is obtained, the width of the target 5 in that direction is used as Dt, and that of the substrate 30 is used as Ds. The value of Dt required for previously given Ds is calculated so that (Dt−Ds)/2L satisfies the above-mentioned conditions. When a substrate for a liquid crystal display device is to be sputtered, the substrate often has a square plate-shaped shape. In this case, the target 5 has a shape adequate for the square shape (in many cases, a similar shape).

The apparatus of the invention may be used for a substrate of an information recording medium such as a hard disk, in addition to the above-mentioned substrates of a device such as a semiconductor integrated circuit and a liquid crystal display device. As the sputtering method, various methods such as parallel-plate DC diode sputtering, RF sputtering, and reactive sputtering which is conducted while introducing a reactive gas may be employed in place of the above-described magnetron sputtering.

As described above, according to the invention, imbalance of the hole bottom coverage ratio in a fine hole in a peripheral portion which has been conventionally observed can be eliminated, and a sufficient bottom coverage ratio can be uniformly obtained over the whole bottom face of the fine hole.

What is claimed is:

1. A sputtering apparatus comprising:

a vacuum vessel having an exhaust system;

a cathode which is disposed in said vacuum vessel and has a target on a front face thereof; and a substrate holder which is used for disposing a substrate so as to be coaxial with and oppose said target in parallel, so that a film is deposited on an inner face of a hole formed in a surface of the substrate in conditions that a distance between the target and the substrate is substantially 150 to 360 mm and that a pressure of an interior of the vacuum vessel is substantially 1 mTorr or less, wherein said target of said cathode has a size Dt at which relationships that $Q_1 = N \cdot Q_2$ and that N is not smaller than 0.7 are established between an angle $Q_1$ satisfying tan $Q_1 = (Dt-Ds)/2L$, and an angle $Q_2$ satisfying tan $Q_2 = A/B$, wherein $Q_1$ is a maximum incident angle formed by a line connecting a point on a peripheral edge of the target and a point on a peripheral side of the substrate and a line extending perpendicular from the point on the peripheral side of the substrate, and Q2 is formed by a line connecting an inner corner portion of a bottom face of the hole to an opposite point on the opening edge of the hole with respect to a depth direction of the hole, and where A indicates a diameter of an opening of the hole in which the film is to be deposited, B indicates a depth of the hole, Ds indicates a size of the substrate, and L indicates the distance between said target and the substrate.

2. The sputtering apparatus according to claim 1, wherein said cathode is a magnetron cathode having a magnet mechanism.

3. The sputtering apparatus according to claim 2, wherein said magnet mechanism includes a center magnet which is disposed at a center thereon, an annular peripheral magnet which surrounds said center magnet, and a plate-shaped yoke which holds said center magnet and peripheral magnet.

4. A sputtering apparatus comprising:

a vacuum vessel having an exhaust system;

a cathode which is disposed in said vacuum vessel and has a target on a front face thereof; and a substrate holder which is used for disposing a substrate so as to be coaxial with and oppose said target in parallel, so that a film is deposited on an inner face of a hole formed in a surface of the substrate in conditions that a distance between the target and the substrate is substantially 150 to 360 mm and that a pressure of an interior of the vacuum vessel is substantially 1 mTorr or less, wherein said target of said cathode has a size Dt at which relationships that $Q_1 = N \cdot Q_2$ and that N is not smaller than 0.7 and not larger than 1.2 are established between an angle $Q_1$ satisfying tan $Q_1 = (Dt-Ds)/2$ L, and an angle $Q_2$ satisfying tan $Q_2 = A/B$, wherein $Q_1$ is a maximum incident angle formed by a line connecting a point on a peripheral edge of the target and a point on a peripheral side of the substrate and a line extending perpendicular from the point on the peripheral side of the substrate, and $Q_2$ is formed by a line connecting an inner corner portion of a bottom face of the hole to an opposite point on an opening edge of the hole with respect to a depth direction of the hole, and where A indicates a diameter of an opening of the hole in which the film is to be deposited, B indicates a depth of the hole, Ds indicates a size of the substrate, and L indicates the distance between said target and the substrate.

5. The sputtering apparatus according to claim 4, wherein said cathode is a magnetron cathode having a magnet mechanism.

6. The sputtering apparatus according to claim 5, wherein said magnet mechanism includes a center magnet which is disposed at a center thereof; an annular peripheral magnet which surrounds said center magnet, and a plate-shaped yoke which holds said center magnet and peripheral magnet.

* * * * *